(12) United States Patent
Liu et al.

(10) Patent No.: US 11,037,877 B2
(45) Date of Patent: Jun. 15, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Zi-Jheng Liu, Taoyuan (TW); Hung-Jui Kuo, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 35 days.

(21) Appl. No.: 16/354,135

(22) Filed: Mar. 14, 2019

(65) Prior Publication Data

US 2020/0294921 A1 Sep. 17, 2020

(51) Int. Cl.
| | |
|---|---|
| *H01L 23/495* | (2006.01) |
| *H01L 23/538* | (2006.01) |
| *H01L 23/31* | (2006.01) |
| *H01L 23/00* | (2006.01) |
| *H01L 25/065* | (2006.01) |
| *H01L 21/48* | (2006.01) |
| *H01L 21/56* | (2006.01) |
| *H01L 25/00* | (2006.01) |

(52) U.S. Cl.
CPC ...... *H01L 23/5381* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 23/562* (2013.01); *H01L 24/16* (2013.01); *H01L 25/0655* (2013.01); *H01L 25/50* (2013.01); *H01L 2224/16225* (2013.01); *H01L 2924/3512* (2013.01)

(58) Field of Classification Search
CPC ............. H01L 23/5381; H01L 23/5383; H01L 23/5386; H01L 25/0655
USPC .................................................. 257/723, 778
See application file for complete search history.

(56) References Cited

U.S. PATENT DOCUMENTS

| | | | |
|---|---|---|---|
| 8,105,875 B1 * | 1/2012 | Hu .................. | H01L 21/561 438/107 |
| 8,456,018 B2 * | 6/2013 | Park ................. | H01L 24/20 257/774 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |

(Continued)

*Primary Examiner* — Nitin Parekh
(74) *Attorney, Agent, or Firm* — JCIPRNET

(57) ABSTRACT

A package structure includes a first die, a second die, a bridge, an encapsulant and a redistribution layer (RDL) structure. The bridge is arranged side by side with the first die and the second die. The encapsulant laterally encapsulates the first die, the second die and the bridge. The RDL structure is disposed on the first die, the second die, the bridge and the encapsulant. The first die and the second die are electrically connected to each other through the bridge and the RDL structure.

20 Claims, 16 Drawing Sheets

(56) References Cited

U.S. PATENT DOCUMENTS

| | | | |
|---|---|---|---|
| 9,443,824 B1* | 9/2016 | We | H01L 23/5384 |
| 9,496,189 B2 | 11/2016 | Yu et al. | |
| 2011/0084382 A1* | 4/2011 | Chen | H01L 24/97 |
| | | | 257/737 |
| 2011/0304349 A1* | 12/2011 | Stillman | H01L 23/49827 |
| | | | 324/756.02 |
| 2019/0109117 A1* | 4/2019 | Fang | H01L 21/6835 |
| 2019/0295952 A1* | 9/2019 | Sikka | H01L 23/5385 |
| 2019/0304914 A1* | 10/2019 | Koh | H01L 23/49822 |
| 2020/0098692 A1* | 3/2020 | Liff | H01L 25/0655 |
| 2020/0266149 A1* | 8/2020 | Xu | H01L 25/0655 |

* cited by examiner

PACKAGE STRUCTURE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

DETAILED DESCRIPTION

Figure 1A:
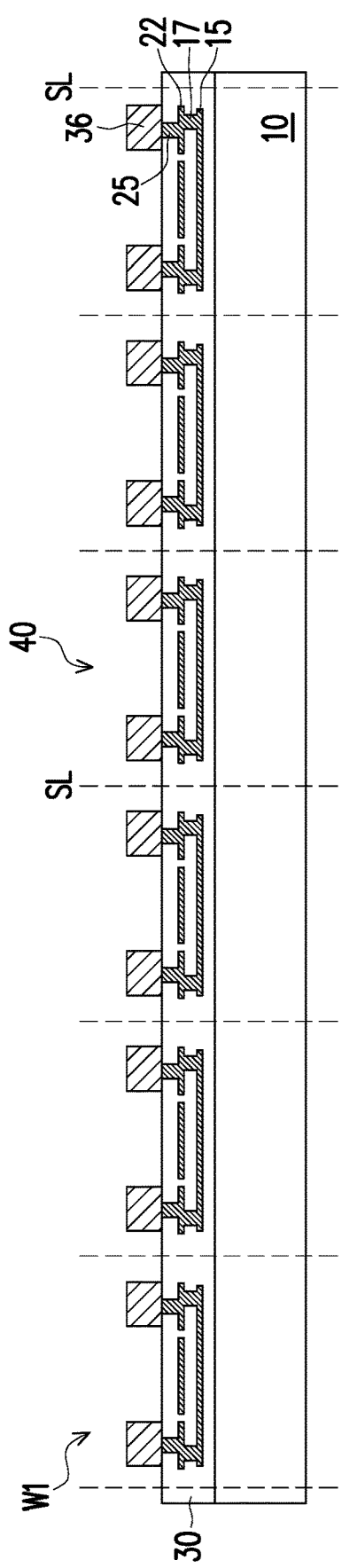
FIG. 1A to FIG. 1G are schematic cross-sectional views illustrating a method of manufacturing a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 4D packaging or 4DIC devices. The testing structures may include, for example, test pads formed in a redistribution layer or on a substrate that allows the testing of the 4D packaging or 4DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating a method of manufacturing a package structure according to some embodiments of the disclosure. FIG. 2A is a top view of a wafer including a plurality of bridges according to some embodiments of the disclosure. FIG. 2B is a top view of a wafer including a plurality of dies according to some embodiments of the disclosure. FIG. 4A to FIG. 4M are schematic cross-sectional views illustrating a method of manufacturing a bridge according to some embodiments of the disclosure.

Figure 2A:
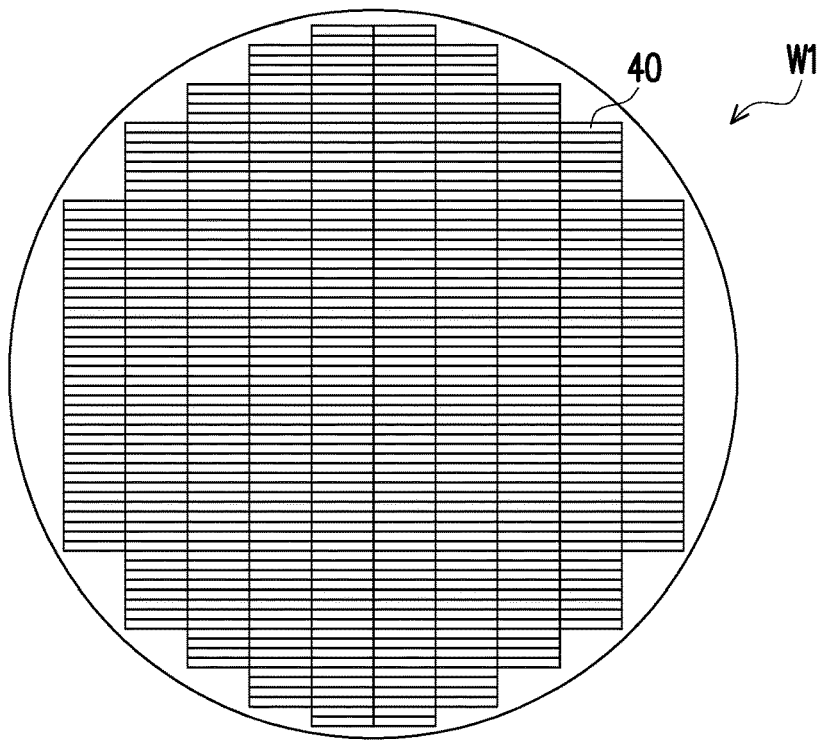
FIG. 2A is a top view of a wafer including a plurality of bridges according to some embodiments of the disclosure.
Figure 2B:
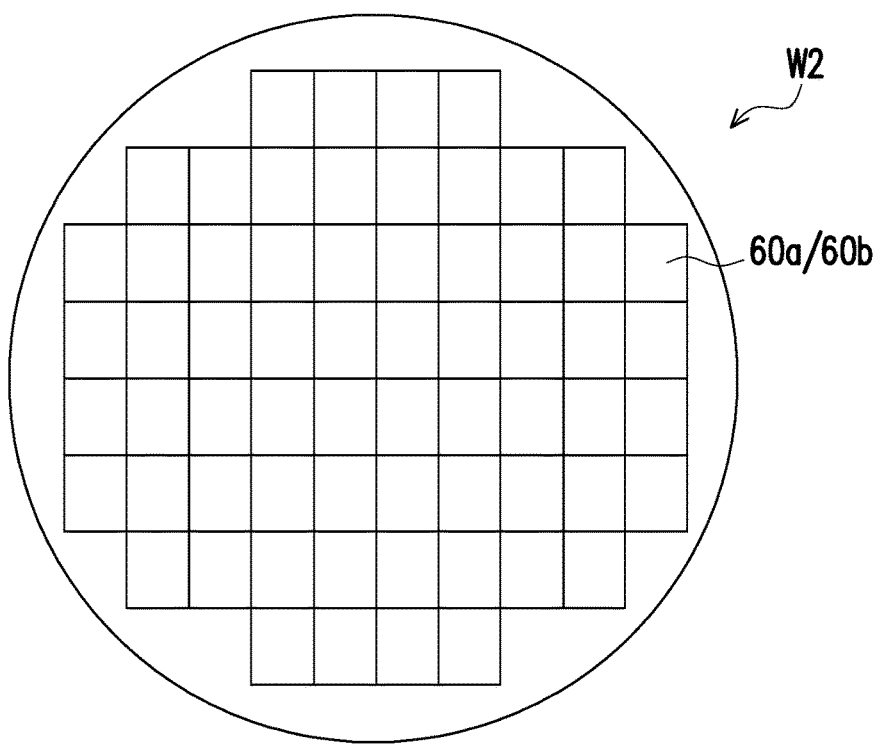
FIG. 2B is a top view of a wafer including a plurality of dies according to some embodiments of the disclosure.

Referring to FIG. 1A and FIG. 2A, in some embodiments, a wafer W1 including a plurality of bridges 40 are provided. The bridge 40 may also be referred to a die-to-die connector, which is used for electrically connecting two dies to each other in the subsequent processes. The bridges 40 may be arranged in an array, and may be spaced from each other by the scribe lines SL. The number of the bridges 40 included in the wafer W1 shown in FIG. 2A is merely for illustration, and the disclosure is not limited thereto.

In some embodiments, the bridge 40 is a die free of active or passive devices. For example, the bridge 40 may include a substrate 10, a dielectric structure 30, an interconnection structure 32 and a plurality of connectors 36. The substrate 10 may be a semiconductor substrate such as a silicon substrate or a semiconductor-on-insulator (SOI) substrate. In some embodiments, the substrate 10 is an undoped silicon substrate. However, the disclosure is not limited thereto. In alternative embodiments, the substrate 10 may be a doped silicon substrate. The doped silicon substrate may be P-type doped, N-type doped, or a combination thereof.

The dielectric structure 30 is formed over the substrate 10. The dielectric structure 30 may be a multi-layer structure including a plurality of dielectric layers. The material of the dielectric structure 30 may include silicon oxide, silicon nitride, silicon oxynitride, undoped silicate glass (USG), phosphosilicate glass (PSG), borosilicate glass (BSG), boron-doped phosphosilicate glass (BPSG), the like or combinations thereof.

The interconnection structure 32 is formed over the substrate 10 and in the dielectric structure 30. In some embodiments, the interconnection structure 32 includes a plurality of conductive lines 15 and 22 and vias 17 and 25 electrically connected to each other. The vias (such as the via 17) are located between different layers of conductive lines (such as the conductive lines 15 and 22), so as to electrically connect the conductive lines in different layers to each other. The conductive lines 15 and 22 and vias 17 and 25 may include conductive materials, such as metal, metal alloy or a combination thereof. For example, the conductive material may include tungsten (W), copper (Cu), copper alloys, aluminum (Al), aluminum alloys, or combinations thereof.

In some embodiments, the conductive lines 15 and 22 of the interconnection structure 32 have a fine pitch. The term "pitch" described herein refers to a line width (L) of the feature (e.g., conductive line) plus the space (S) between the said feature and the next immediately adjacent feature. Further, the "pitch" descried herein refers to the pitch between two adjacent conductive lines arranged in the same layer. In some embodiments, the line width/space (L/S) of the conductive line 15 or 22 ranges from 0.4 μm/0.4 μm to 2 μm/2 μm, such as 0.8 μm/0.8 μm. The number of the layers of the conductive lines and vias shown in FIG. 1A is merely for illustration, and the disclosure is not limited thereto.

The connectors 36 are formed on the dielectric structure 30 and the interconnection structure 32, and are electrically connected to the interconnection structure 32. For example, the connectors 36 are connected to the conductive line 22 through the vias 25. The connector 36 may include gold bumps, copper bumps, copper posts, copper pillars, or the like or combinations thereof. In some embodiments, the sidewalls and top surfaces of the connector 36 are exposed, but the disclosure is not limited thereto. In alternative embodiments, the bridge 40 may further include a passivation layer on the dielectric structure 30. The passivation layer may cover sidewalls or/and the top surfaces of the connectors 36.

FIG. 4A to FIG. 4I are the schematic cross-sectional views illustrating a method of manufacturing the wafer W1 including the bridges 40 according to some embodiments of the disclosure. It is noted that, the manufacturing method shown in FIG. 4A to FIG. 4I is merely for illustration, and the disclosure is not limited thereto. For the sake of brevity, FIG. 4A to FIG. 4I merely illustrates the forming of one bridge 40 of the wafer W1. It is understood that the wafer W1 includes more than one bridges, as shown in FIG. 2A.

Figure 4A:
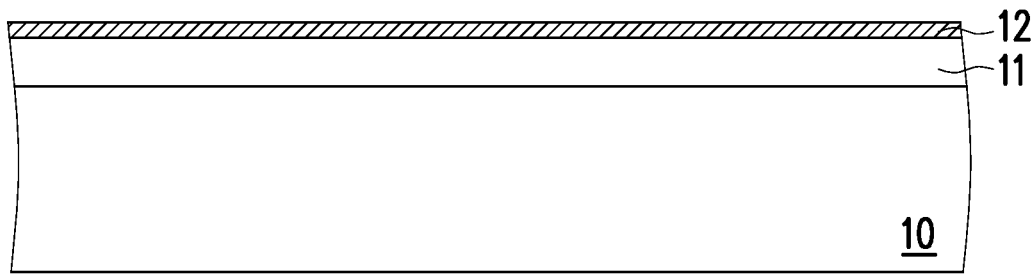
FIG. 4A to FIG. 4M are schematic cross-sectional views illustrating a method of manufacturing a bridge according to some embodiments of the disclosure.

Referring to FIG. 4A, the substrate 10 is provided. A dielectric layer 11 is formed on the substrate 10. The material of the dielectric layer 11 may be referred to the materials of the dielectric structure 30 described above. The dielectric layer 11 may be formed by a suitable technology such as chemical vapor deposition (CVD) process, plasma enhanced CVD (PECVD) process, flowable CVD (FCVD) process, spin coating and curing processes, or the like.

A seed layer 12 is formed on the dielectric layer 11 by a sputtering process, for example. The seed layer 12 may be a metal seed layer such as a copper seed layer. In some embodiments, the seed layer includes a first metal layer such as a titanium layer and a second metal layer such as a copper layer over the first metal layer.

Figure 4B:
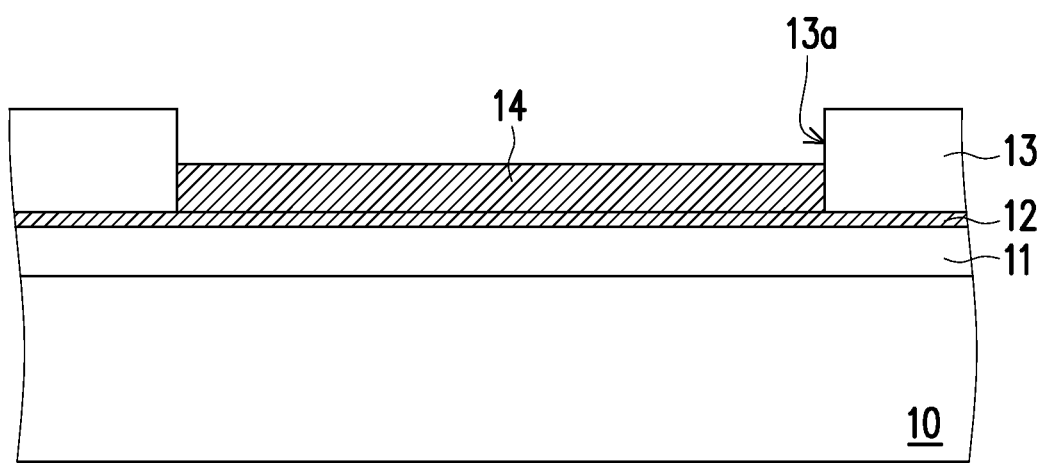

Referring to FIG. 4B, a patterned mask layer 13 is formed on the seed layer 12. The patterned mask layer 13 has one or more openings 13a exposing a portion of the top surface of the seed layer 12. The patterned mask layer 13 may be formed by forming a mask layer such as a photoresist layer on the seed layer 12, thereafter, exposure and developing processes are performed on the mask layer to form the opening 13a. The opening 16a may be a line trench. A conductive layer 14 is then formed on the seed layer 12 exposed by the patterned mask layer 13. The conductive layer 14 includes a suitable metal, such as copper, and may be formed by a plating process, for example.

Figure 4C:
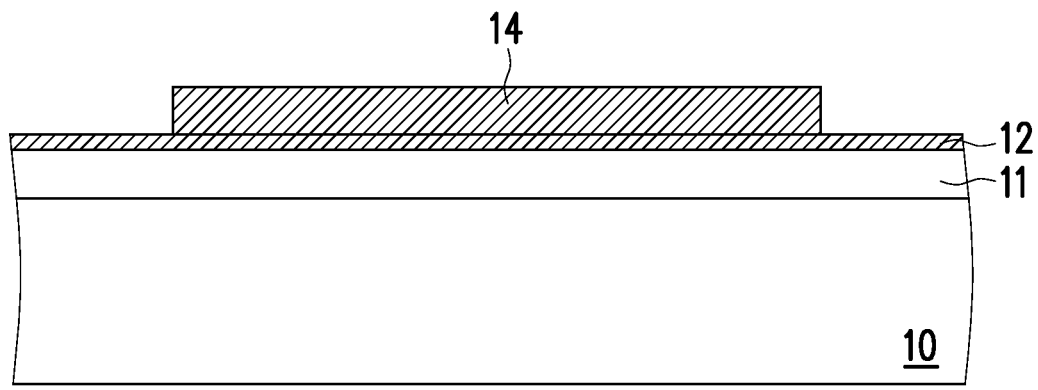
Figure 4D:
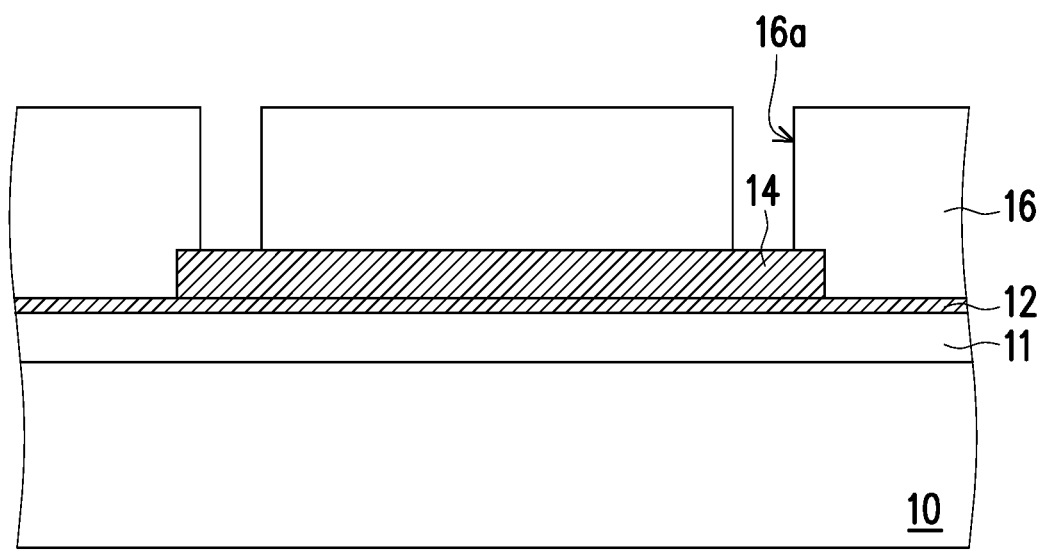

Referring to FIG. 4C and FIG. 4D, the patterned mask layer 13 is stripped, and a patterned mask layer 16 is then formed on the seed layer 12 and the conductive layer 14. The patterned mask layer 16 has a plurality of openings 16a exposing portions of the top surfaces of the conductive layer 14. The patterned mask layer 16 may be formed by forming a mask layer such as a photoresist layer on the conductive layer 14, thereafter, exposure and developing processes are performed on the mask layer to form the opening 16a. The opening 16a may be a hole or a trench.

Figure 4E:
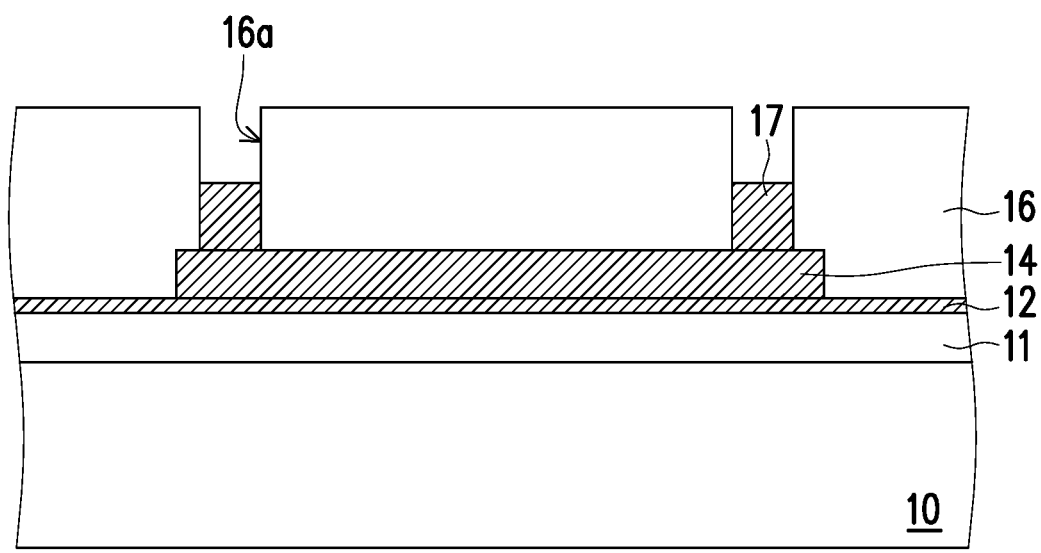
Figure 4F:
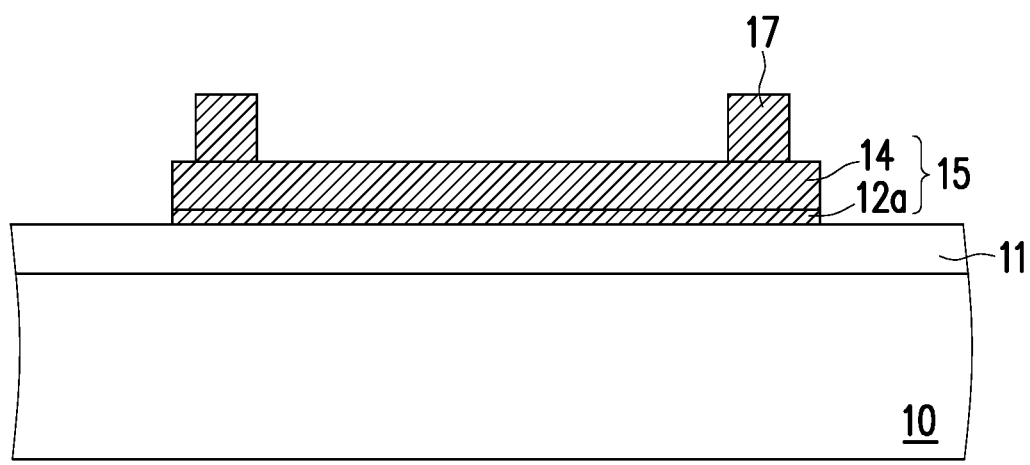

Referring to FIG. 4E and FIG. 4F, a conductive layer 17 is formed on the conductive layer 14 exposed by the openings 16a of the patterned mask layer 16. The conductive layer 17 includes a suitable metal, such as copper, and may be formed by a plating process, for example. In some embodiments, the conductive layer 14 serves as a seed layer of the plating of the conductive layer 17. Thereafter, the patterned mask layer 16 is stripped. The seed layer 12 not covered by the conductive layer 14 is removed, and a seed layer 12a is formed. In some embodiments, the seed layer 12 is removed by an etching process, for example. The etching process is performed by using the conductive layer 17 and the conductive layer 14 as an etching mask.

Referring to FIG. 4F, the conductive layer 14 and the underlying seed layer 12a constitute the conductive lines 15, the conductive layer 17 is also referred to as the via 17. In this embodiments, the via 17 includes the conductive layer directly formed on the conductive line 15, and no seed layer is located between the via 17 and the conductive line 15. However, the disclosure is not limited thereto. In alternative embodiments, a seed layer may be formed between the conductive layer 17 and the conductive line 15, and the seed layer and the conductive layer 17 constitute the via.

Figure 4G:
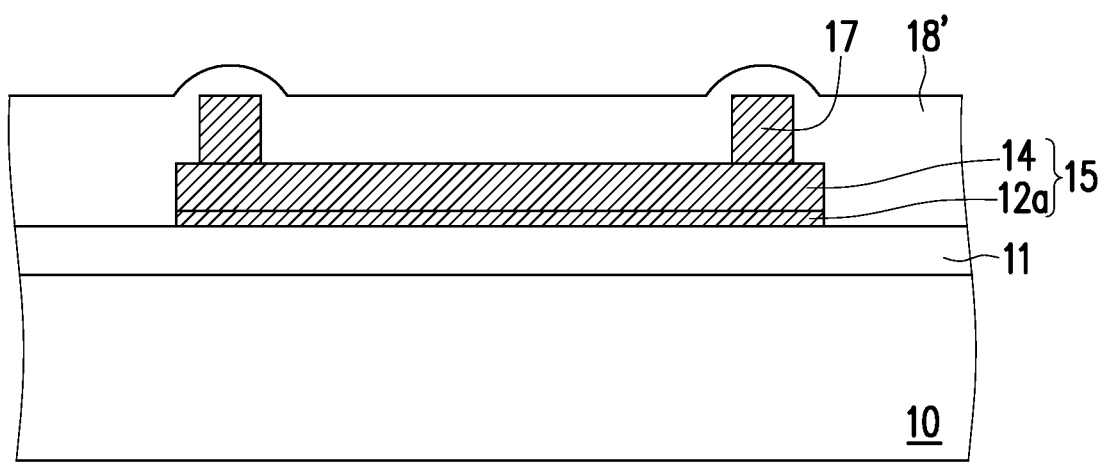
Figure 4H:
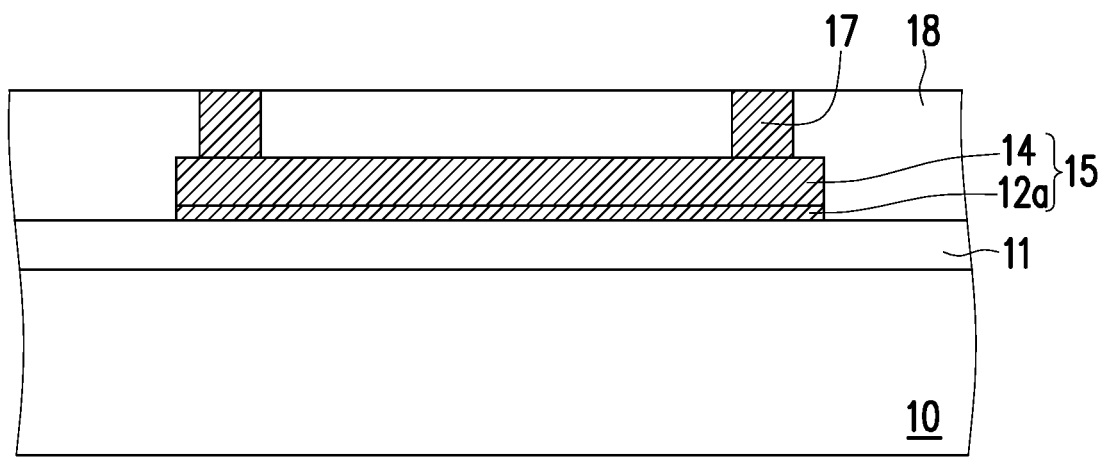
Figure 4I:
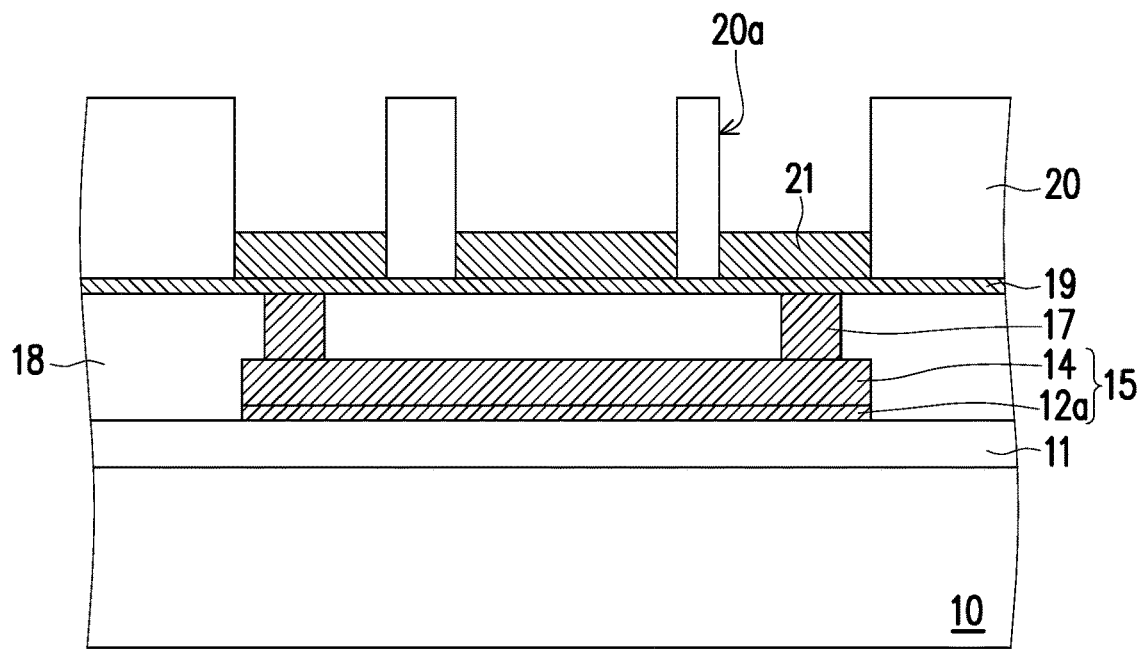

Referring to FIG. 4G and FIG. 4H, a dielectric material layer 18' is formed over the substrate 10 to cover the top surface of the dielectric layer 11, and the top surfaces and sidewalls of the conductive line 15 and the vias 17. Thereafter, a planarization process is performed to remove a portion of the dielectric material layer 18', such that a dielectric layer 18 having planarized top surface is formed, and the top surfaces of the vias 17 are exposed. The planarization process may include chemical a mechanical polishing (CMP) process. In some embodiments, after the planarization process, the top surface of the dielectric layer 18 is substantially coplanar with the top surfaces of the vias 17. In this embodiment, since the dielectric layer 18 aside the conductive line 15 and the dielectric layer 18 aside the via 17 are formed simultaneously, no interface is formed in the dielectric layer 18.

Referring to FIG. 4I to FIG. 4L, processes similar to those descried in FIG. 4A to FIG. 4H are performed to form the conductive lines 22, the vias 25 and the dielectric layer 28. For example, referring to FIG. 4I, a seed layer 19 is formed on the dielectric layer 18 and the vias 17. A patterned mask layer 20 having openings 20a is formed on the seed layer 19. A conductive layer 21 is formed on the seed layer 19 exposed by the openings 20a of the patterned mask layer 20.

Figure 4J:
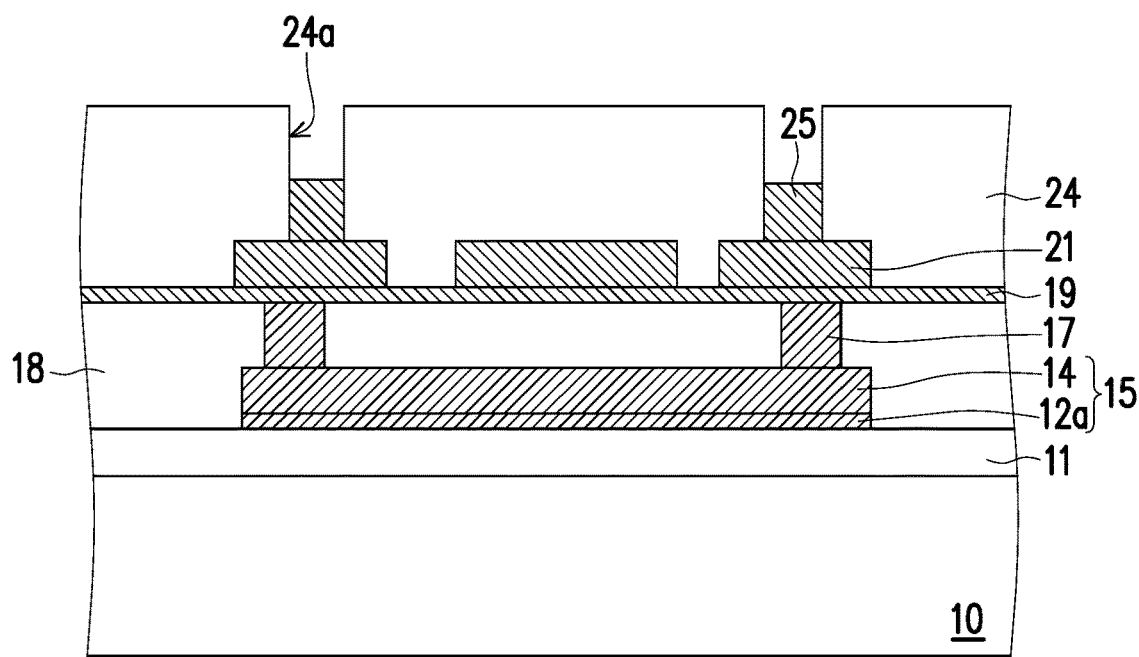
Figure 4K:
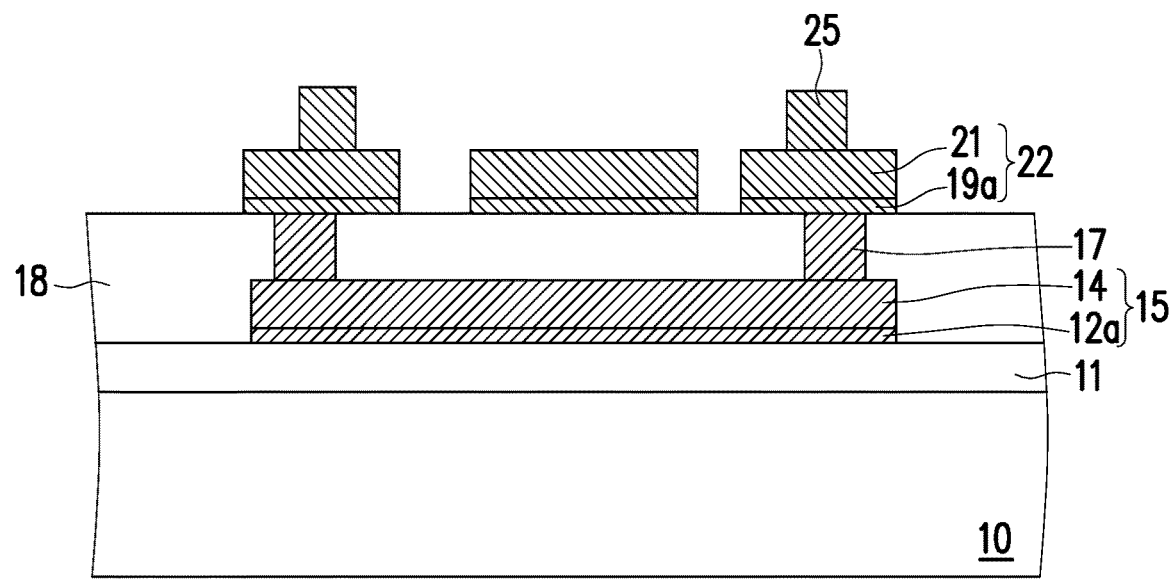

Referring to FIG. 4J and FIG. 4K, the patterned mask layer 20 is stripped, and a patterned mask layer 24 is formed on the seed layer 19 and the conductive layer 21. The patterned mask layer 24 has a plurality of openings 24a exposing portions of the top surface of the conductive layer 21. A conductive layer 25 is then formed on the conductive layer 21 exposed by the patterned mask layer 24. Thereafter, the patterned mask layer 24 is stripped, the seed layer 19 not covered by the conductive layer 21 is removed, and a seed layer 19a is formed.

Referring to FIG. 4K, the conductive layer 21 and the underlying seed layer 19a constitute the conductive lines 22. The conductive layer 25 is also referred to as the via 25. In some embodiments, no seed layer is formed between the conductive layer 25 and the conductive layer 21, but the disclosure is not limited thereto. The via 25 is electrically connected to the conductive line 22, and the conductive line 22 is electrically connected to the conductive line 15 through the vias 17.

Figure 4L:
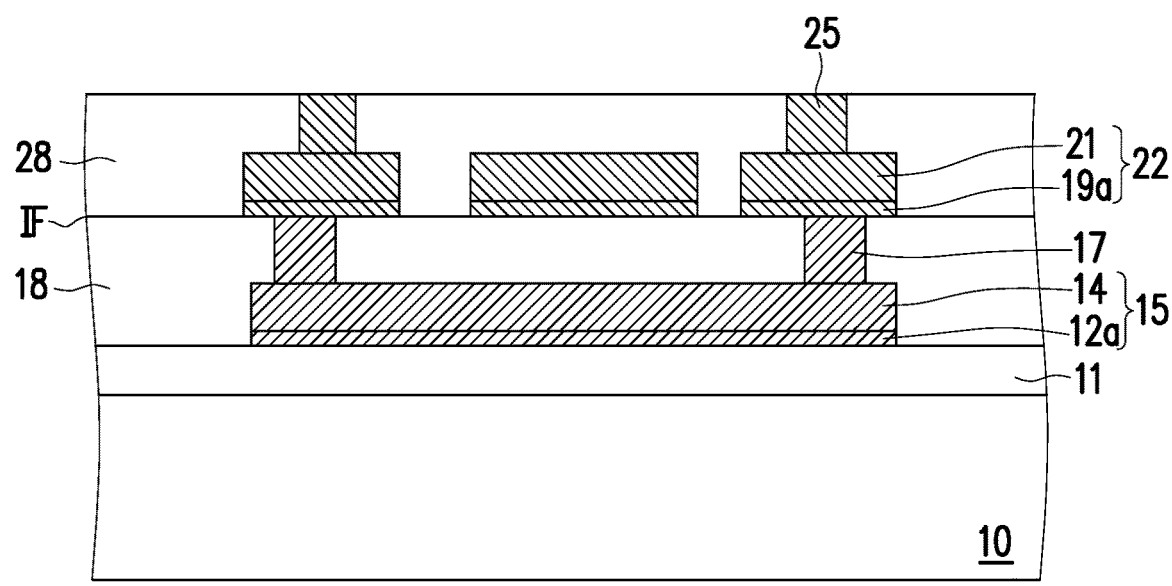

Referring to FIG. 4L, the dielectric layer 28 is formed on the dielectric layer 18 and laterally aside the conductive lines 22 and vias 25. The forming method of the dielectric layer 28 is similar to that of dielectric layer 18, which are not descried again. In some embodiments, the top surface of the dielectric layer 28 is substantially coplanar with the top surfaces of the vias 25. An interface IF is existed between the dielectric layer 28 and the dielectric layer 18.

Figure 4M:
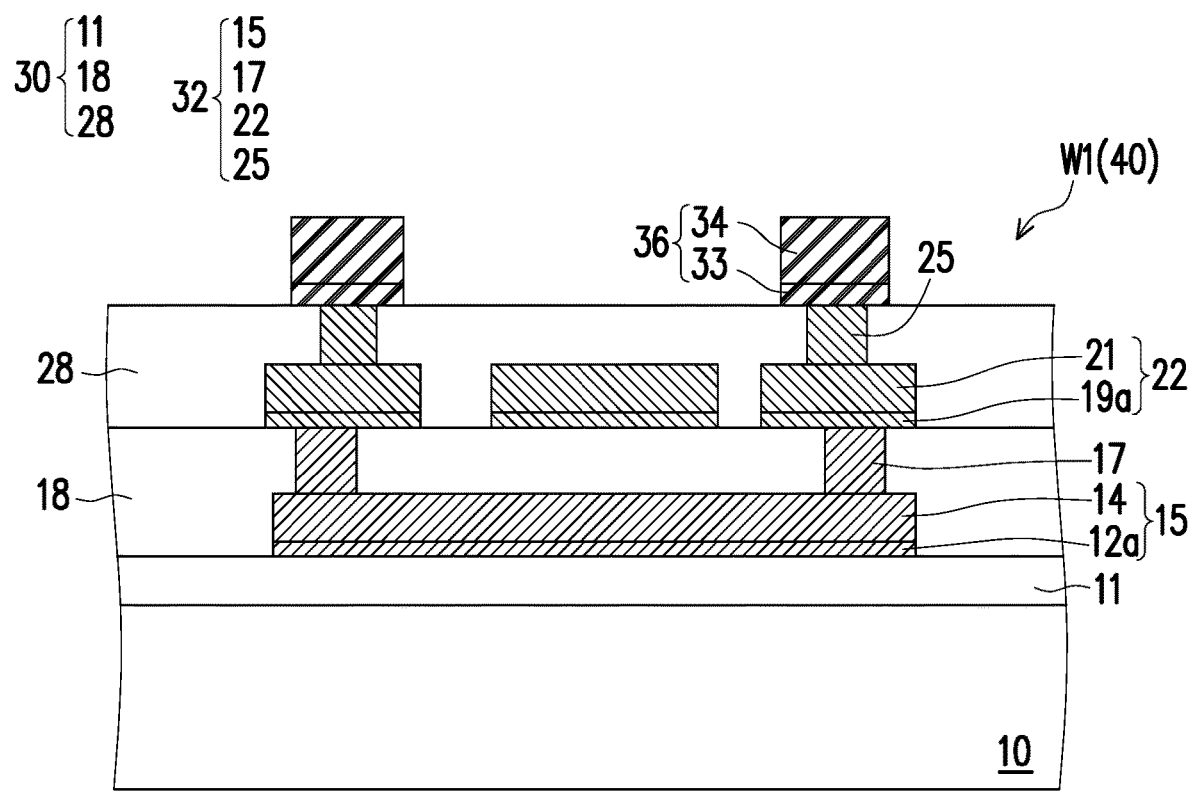

Referring to FIG. 4M, a plurality of connector 36 are formed on and electrically connected to the vias 25. In some embodiments, the connector 36 includes a seed layer 33 and a conductive layer 34 on the seed layer 33. The materials and forming method of the seed layer 33 and the conductive layer 34 are similar to, and may be the same as or different from those of the seed layer and conductive layer described above. The connector 36 is electrically connected to the conductive lines 22 through the via 25, and further electrically connected to the conductive lines 15 through the vias 17.

As such, the wafer W1 including the bridges 40 is thus formed. The forming method of the bridges 40 are not limited to those described according to FIG. 4A to FIG. 4M. Other suitable forming method may also be used to form the wafer W1 in alternative embodiments.

Referring back to FIG. 1A to FIG. 1B, in some embodiments, a singulating process is performed on the wafer W1 along the scribe lines SL, so as to singulate the bridges 40. The singulating process may include a die saw process such as laser saw process, plasma saw process, or a combination thereof.

Figure 1B:
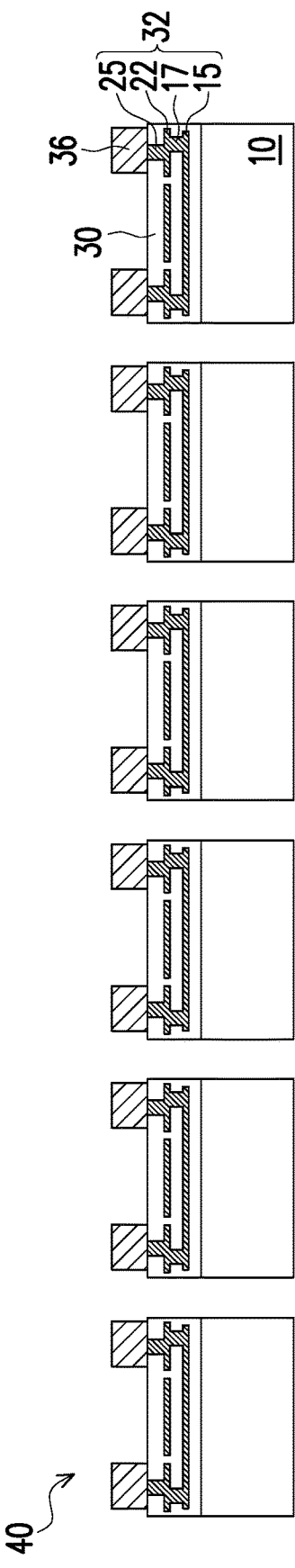

Referring to FIG. 1B, after the singulating process, each bridge 40 includes the substrate 10, the dielectric structure 30, the interconnection structure 32 and the connectors 36. For the sake of brevity, the seed layer and conductive layers included in the interconnection structure 32 and the connector 36 are not specifically shown in FIG. 1A to FIG. 1G.

Figure 1C:
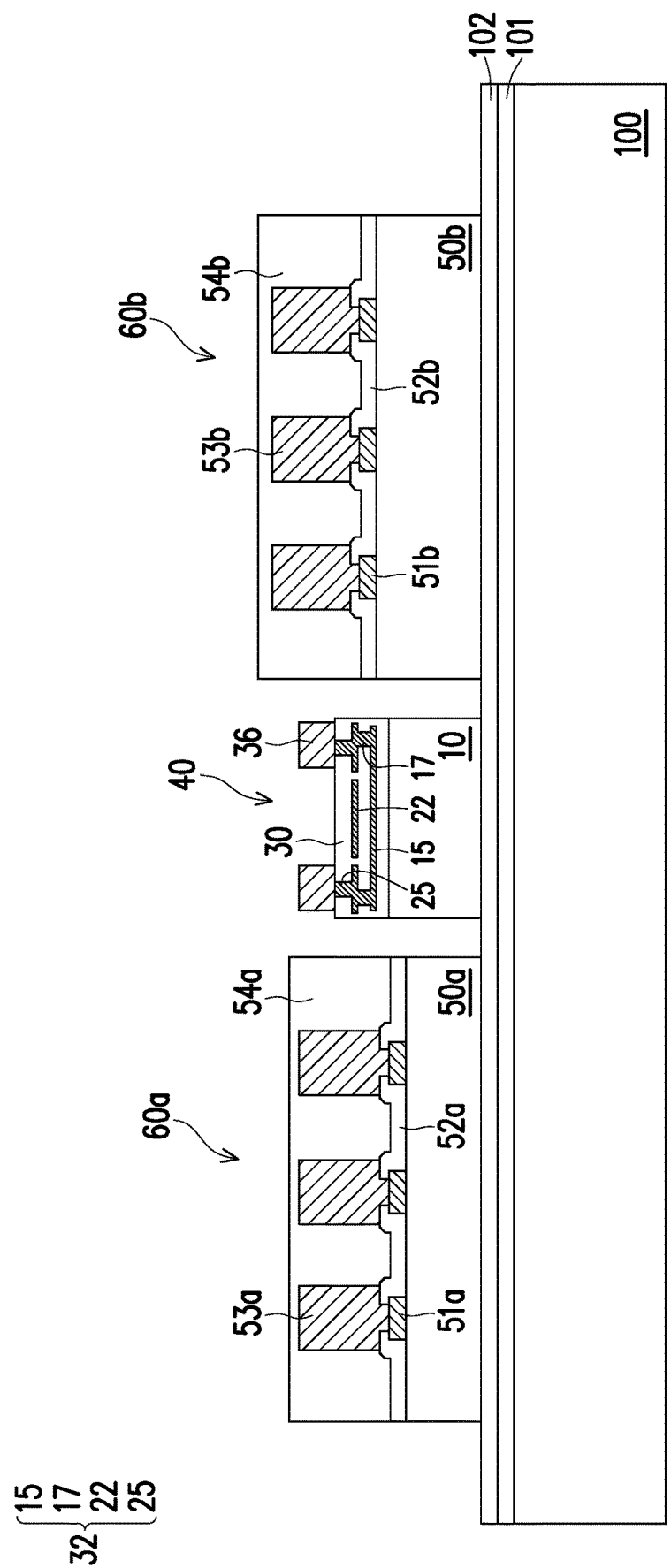

Referring to FIG. 1C, a carrier 100 is provided. The carrier 100 may be a glass carrier, a ceramic carrier, or the like. A de-bonding layer 101 is formed on the carrier 100 by, for example, a spin coating method. In some embodiments, the de-bonding layer 101 may be formed of an adhesive such as an Ultra-Violet (UV) glue, a Light-to-Heat Conversion (LTHC) glue, or the like, or other types of adhesives. The de-bonding layer 101 is decomposable under the heat of light to thereby release the carrier 100 from the overlying structures that will be formed in subsequent steps.

Still referring to FIG. 1A, a die 60a, a die 60b and a bridge 40 are attached to the de-bonding layer 101 over the carrier 100 through an adhesive layer 102 such as a die attach film (DAF), silver paste, or the like. In some embodiments, the size of the adhesive layer 102 is substantially the same as the carrier 100, but the disclosure is not limited thereto. In alternative embodiments, the adhesive layer 102 is merely disposed between the die 60a and the de-bonding layer 101, between the die 60b and the de-bonding layer 101, and between the bridge 40 and the de-bonding layer 101, respectively. In some embodiments, the die 60a, the die 60b and the bridge 40 are disposed side by side over the carrier 100, and the bridge 40 is disposed laterally between the die 60a and the die 60b. In some embodiments, the dies 60a and 60b and the bridge 40 are mounted over the carrier 100 through pick and place processes. In some embodiments, before mounting the dies 60a and 60b and the bridge 40 to the carrier 100, a testing process may be performed to check whether the dies and the bridge are good, such that good dies and good bridge are mounted to the carrier 100.

In some embodiments, the die 60a and the die 60b may respectively be a system-on-chip (SoC), an application-specific integrated circuit (ASIC) chip, an analog chip, a sensor chip, a wireless and radio frequency chip, a voltage regulator chip or a memory chip. The memory chip includes a high bandwidth memory (HBM) chip, a flash memory chip, a dynamic random access memory (DRAM) chip, or a static random access memory (SRAM) chip. The die 60a and the die 60b may be the same types of dies or the different types of dies.

In some embodiments, the die 60a and the die 60b have a similar structure. For the sake of brevity, the following description takes the die 60a as an example. In some embodiments, the die 60a includes a substrate 50a, a plurality of pads 51a, a passivation layer 52a, a plurality of connectors 53a and a passivation layer 54a. In some embodiments, the substrate 50a is made of silicon or other semiconductor materials. Alternatively or additionally, the substrate 50a includes other elementary semiconductor materials such as germanium, gallium arsenic, or other suitable semiconductor materials. In some embodiments, the substrate 50a may further include other features such as various doped regions, a buried layer, and/or an epitaxy layer. Moreover, in some embodiments, the substrate 50a is made of an alloy semiconductor such as silicon germanium, silicon germanium carbide, gallium arsenic phosphide, or gallium indium phosphide. Furthermore, the substrate 50a may be a semiconductor on insulator such as silicon on insulator (SOI) or silicon on sapphire.

In some embodiments, a plurality of devices (not shown) are formed in or on the substrate 50a. In some embodiments, the devices may be active devices, passive devices, or a combination thereof. In some embodiments, the devices are integrated circuit devices. The devices are, for example, transistors, capacitors, resistors, diodes, photodiodes, fuse devices, or the like, or combinations thereof.

In some embodiments, an interconnection structure and a dielectric structure (not shown) are formed over the devices on the substrate 50a. The interconnection structure is formed in the dielectric structure and connected to different devices to form a functional circuit. In some embodiments, the dielectric structure includes an inter-layer dielectric layer (ILD) and one or more inter-metal dielectric layers (IMD). In some embodiments, the interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

In some embodiments, the number of the layers of the conductive lines included in the interconnection structure of the die 60a is larger than the number of the layers of the conductive lines 15 and 22 included in the interconnection structure 32 of the bridge 40. In some embodiments, the pitch of the conductive lines of the die 60a may be larger than the pitch of the conductive lines 15 or 22 of the bridge 40. However, the disclosure is not limited thereto.

The pads 51a may be or electrically connected to a top conductive feature of the interconnection structure, and further electrically connected to the devices formed on the substrate 50a through the interconnection structure. The passivation layer 52a is formed over the substrate 50a and covers a portion of the pads 51a. A portion of the pads 51a is exposed by the passivation layer 52a and serves as an external connection of the die 60a. The connectors 53a are formed on and electrically connected to the pads 51a not covered by the passivation layer 52a. The connector 53a includes gold bumps, copper bumps, copper posts, copper pillars, or the like. The passivation layer 54a is formed over the passivation layer 52a. In some embodiments, the passivation layer 54a covers the sidewalls and top surfaces of the connectors 53a, that is, the top surface of the passivation layer 54a is higher than the top surfaces of the connectors 53a. In alternative embodiments, the passivation layer 54a may be laterally aside the connectors 53a and covers the sidewalls of the connectors 53a. The top surface of the passivation layer 54a may be coplanar with the top surfaces of the connectors 53a. That is, the top surfaces of the connectors 53a may be exposed.

The passivation layers 52a and 54a respectively include an insulating material such as silicon oxide, silicon nitride, polymer, or combinations thereof. The polymer include, for example, polybenzoxazole (PBO), polyimide (PI), benzocyclobutene (BCB), the like or combinations thereof. The materials of the passivation layer 52a and the passivation layer 54a may be the same or different.

Referring to FIG. 1C, FIG. 2A and FIG. 2B, in some embodiments, the die 60a is cut from a wafer W2. For example, the wafer W2 includes a plurality of dies 60a arranged in an array. In some embodiments, the wafer W2 has a same size (e.g. diameter) as the wafer W1. The size of the die 60a is larger than the size of the bridge 40. The number of the dies 60a included in the wafer W2 is less than the number of the bridges 40 included in the wafer W1. In some embodiments, the wafer W1 and the wafer W2 have the same size, and the ratio of the number of the bridges 40 included in the wafer W1 to the number of the dies 60a included in the wafer W2 ranges from 5 to 20, such as 9. In one embodiment, the bridge 40 has a size of 26 mm×3.6 mm, and the number of the bridges 40 included in the wafer W1 is 576, while the die 60a has a size of 26 mm×33 mm, and the number of the dies 60a included in the wafer W2 is 64.

In some embodiments, the die 60b includes a substrate 50b, a plurality of pads 51b, a passivation layer 52b, a plurality of connectors 53b and a passivation layer 54b. The structure of the die 60b is similar to the structure of the die 60a, which are not described again.

In some embodiments, the die 60a and the die 60b are cut from different wafers, but the disclosure is not limited thereto. In alternative embodiments, the die 60a and the die 60b are cut from a same wafer.

As shown in FIG. 1C, in some embodiments, the die 60a, the die 60b and the bridge 40 have different thicknesses (or heights). For example, the die 60b is thicker than the die 60a, and the die 60a is thicker than the bridge 40. However, the disclosure is not limited thereto. In some other embodiments, the die 60a, the die 60b and the bridge 40 may have the same thickness.

Figure 1D:
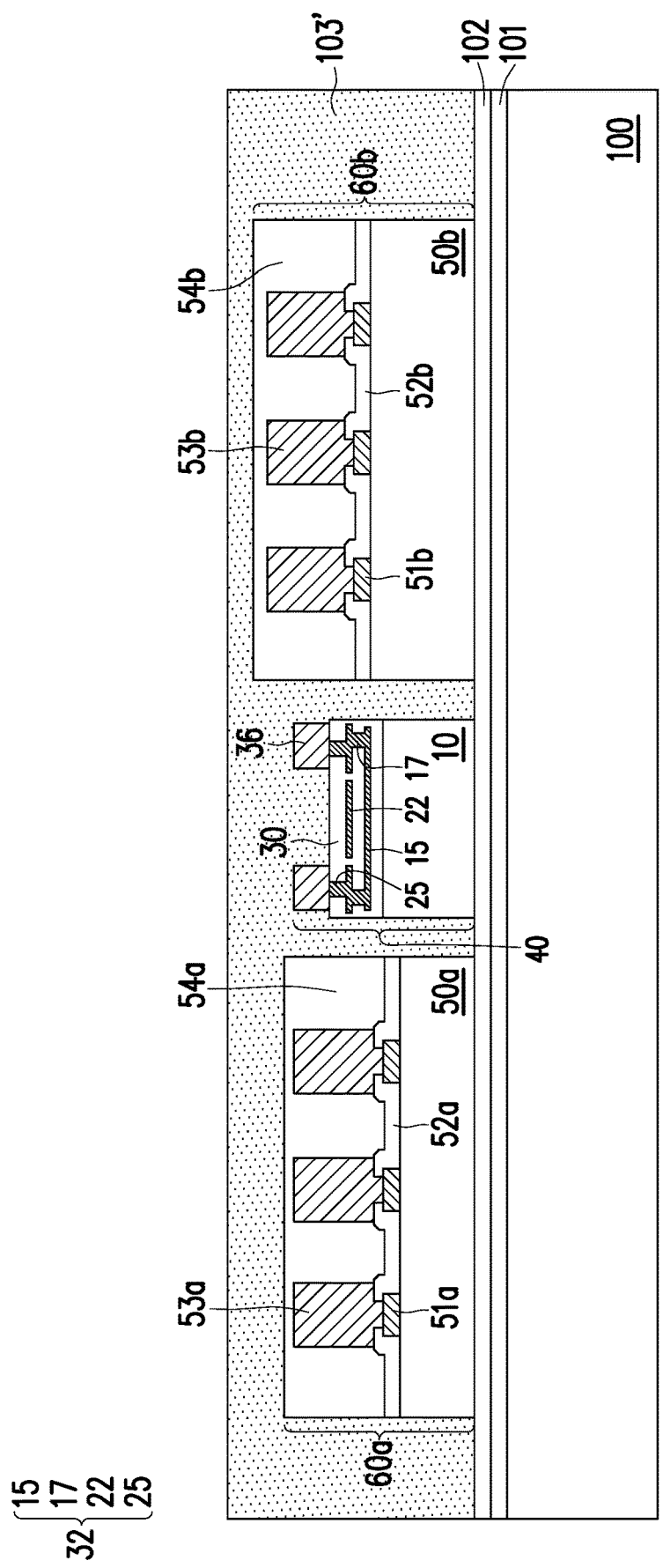

Referring to FIG. 1D, an encapsulant material layer 103' is then formed over the carrier 10 to encapsulate sidewalls and top surfaces of the dies 60a and 60b. In some embodiments, the encapsulant material layer 103' includes a molding compound, a molding underfill, a resin such as epoxy, a combination thereof, or the like. The molding compound may include a polymer material and fillers distributed in the polymer material. In some other embodiments, the encapsulant material layer 103' includes a photo-sensitive material such as polybenzoxazole (PBO), polyimide, benzocyclobutene (BCB), a combination thereof, or the like, which may be easily patterned by exposure and development processes or laser drilling process. In alternative embodiments, the encapsulant material layer 103' includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant material layer 103' is formed by a suitable fabrication technique such as molding process, spin-coating, lamination, deposition, or similar processes.

Figure 1E:
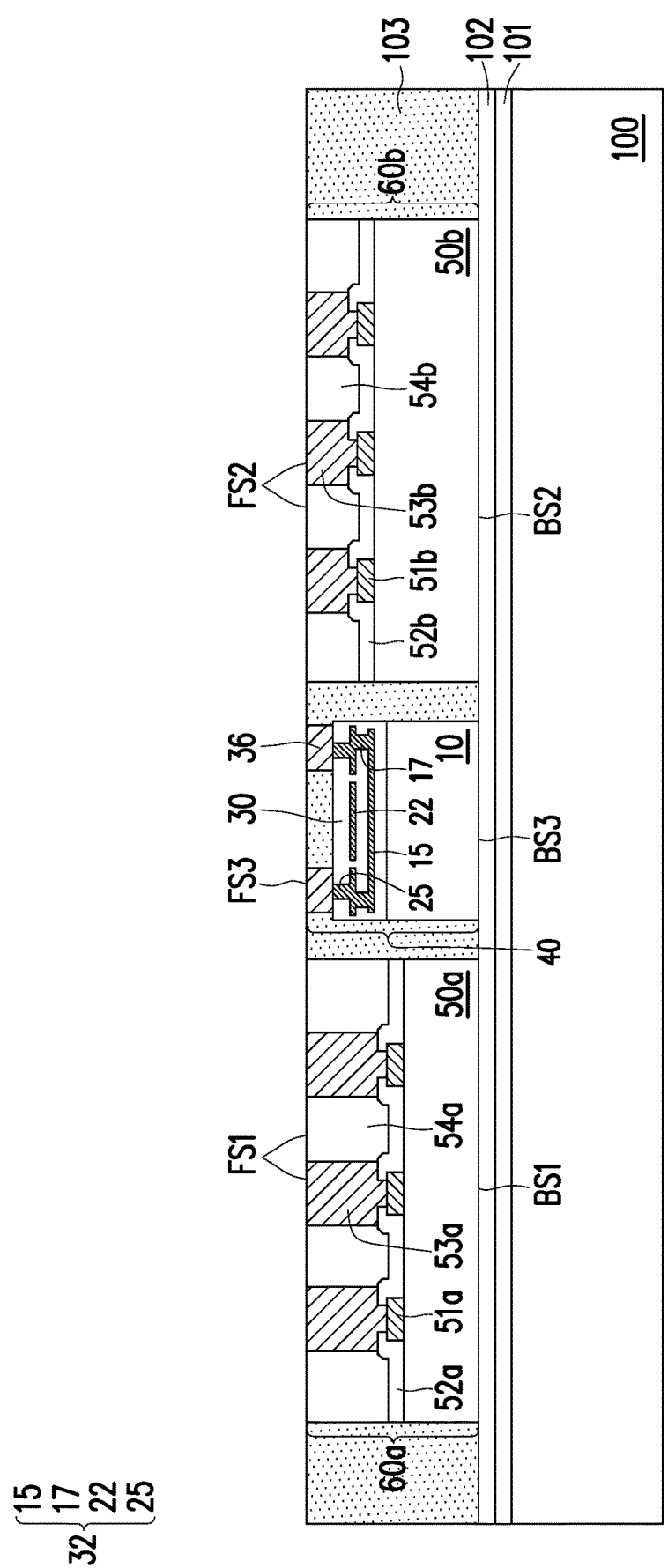

Referring to FIG. 1D and FIG. 1E, a planarization process is performed to planarize the top surfaces of the dies 60a and 60b, the bridge 40, and the encapsulant material layer 103', such that an encapsulant 103 laterally aside the dies 60a and 60b and the bridge 40 is formed. In some embodiments in which the dies 60a and 60b and the bridge 40 have different thicknesses, the planarization process is performed until the connectors of the die or bridge having smallest thickness is exposed. For example, in the embodiments in which the die 60b is thicker than the die 60a, and the die 60a is thicker than the bridge 40, the planarization process may remove a portion of the encapsulant material layer 103', portions of the passivation layer 54b and the connectors 53b of the die 60b and a portion of the passivation layer 54a of the die 60a. In some embodiments, portions of the connectors 53a of the die 60a and portions of the connectors 36 of the bridge 40 may also be removed by the planarization process. However, the disclosure is not limited thereto. In alternative embodiments, the dies 60a and 60b and the bridge 40 may have substantially the same thickness, and the connectors 53a and 53b of the dies 60a and 60b are exposed by the passivation layer 54a and 54b before the encapsulating material layer 103' is formed, the planarization process may remove a portion of the encapsulating material layer 103' without removing portions of the dies 60a and 60b or/and the bridge 40. In some embodiments, the planarization process includes a grinding or a poling process such as a CMP process.

Referring to FIG. 1E, after the planarization process is performed, the top surfaces of the connectors 53a and 53b of the dies 60a and 60b are exposed, and the top surfaces of the connectors 53a and 53b are substantially coplanar with the top surfaces of the passivation layers 54a and 54b. The top surfaces of the connectors 53a and the top surface of the passivation layer 54a constitute the top surface (front surface FS1) of the die 60a. The top surfaces of the connectors 53b and the top surface of the passivation layer 54b constitute the top surface (front surface FS2) of the die 60b. The front surface FS1/FS2 may also be referred to as active surfaces of the die 60a/60b. The dies 60a and 60b respectively include the back surface BS1 and BS2 opposite to the front surface FS1 and FS2. The back surface BS1/BS2 is also referred to as the bottom surface of the substrate 50a/50b of the die 60a/60b. Similarly, the bridge 40 has a front surface (that is, the top surfaces of the connectors 36) FS3 and a back surface BS3 opposite to each other.

Still referring to FIG. 1E, in some embodiments, the front surface FS1 of the die 60a, the front surface FS2 of the die 60b, the front surface FS3 of the bridge 40 and the top surface of the encapsulant 103 are substantially coplanar with each other. The back surface BS1 of the die 60a, the back surface BS2 of the die 60b, the back surface BS3 of the bridge 40 and the bottom surface of the encapsulant 103 are substantially coplanar with each other. In some embodiments, the encapsulant 103 laterally encapsulates sidewalls of the dies 60a and 60b and the bridge 40. Portions of the encapsulant 103 are located between the die 60a and the bridge 40, and between the die 60b and the bridge 40.

In some embodiments, a portion of the encapsulant 103 is located on the dielectric structure 30 and laterally aside the connectors 36 of the bridge 40, such that the sidewalls of the connectors 36 are covered and in physical contact with the encapsulant 36. The connectors 53a and 53b of the dies 60a and 60b may separate from the encapsulant 103 by the passivation layers 54a and 54b. However, the disclosure is not limited thereto. The die 60a, the die 60b and the bridge 40 may optionally include the passivation layer aside the connectors 53a, 53b and 36, respectively. In some other embodiments, passivation layer may be formed aside the connectors 36 of the bridge 40, such that the connectors 36 are separated from the encapsulant 103. In some embodiments, the die 60a or 60b may be free of the passivation layer 54a or 54b, such that a portion of the encapsulant 103 may be formed on the passivation layer 52a or 52b and aside the connectors 53a or 53b, the portion of the encapsulant 103 is in physical contact with the sidewalls of the connectors 53a or 53b.

Figure 1F:
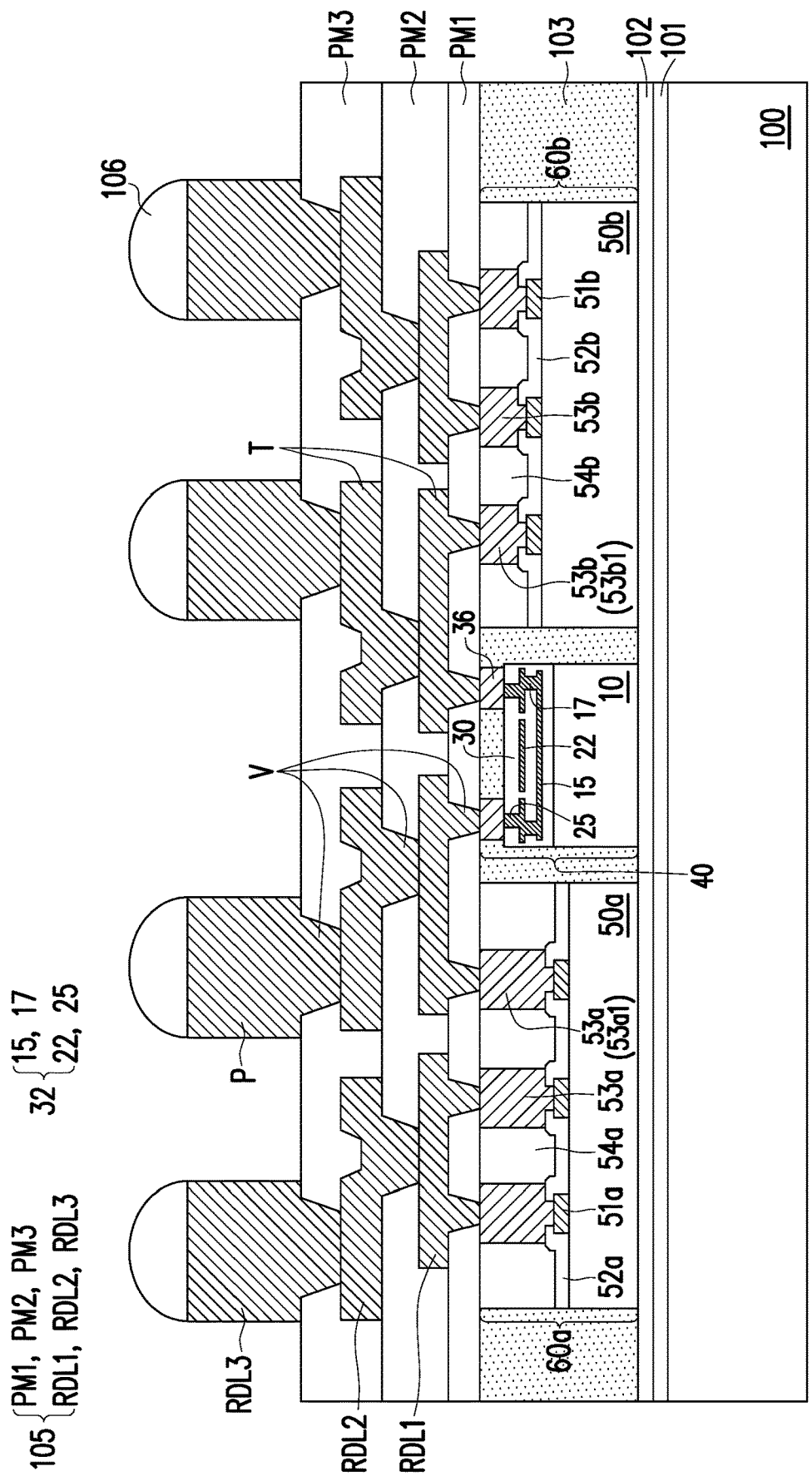

Referring to FIG. 1F, a redistribution layer (RDL) structure 105 is formed over and electrically connected to the dies 60a and 60b and the bridge 40. In some embodiments, the die 60a and the die 60b are electrically connected to each other through the bridge 40 and the RDL structure 105. In some embodiments, the RDL structure 105 is referred to as a "front-side redistribution layer structure", wherein the "front-side" refers to a side close to the front surfaces FS1 and FS2 of the dies 60a and 60b. In some embodiments, the RDL structure 105 includes a plurality of polymer layers PM1, PM2, and PM3 and a plurality of redistribution layers RDL1, RDL2, and RDL3 stacked alternately. The number of the polymer layers or the redistribution layers is not limited in the disclosure.

The redistribution layer RDL1 penetrates through the polymer layer PM1 and is electrically connected to the connectors 53a and 53b of the dies 60a and 60b and the connectors 36 of the bridge 40. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2.

In some embodiments, each of the polymer layers PM1, PM2, PM3 includes a photo-sensitive material such as polybenzoxazole (PBO), polyimide (PI), benzocyclobutene (BCB), a combination thereof or the like. In some embodiments, each of the redistribution layers RDL1, RDL2, RDL3 includes conductive materials. The conductive materials includes metal such as copper, nickel, titanium, a combination thereof or the like, and is formed by physical vapor deposition process (such as sputtering), electroplating process or a combination thereof. In some embodiments, the redistribution layers RDL1, RDL2, RDL3 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metals.

In some embodiments, the redistribution layers RDL1, RDL2 respectively include a plurality of vias V and a plurality of traces T connected to each other. The vias V of the redistribution layer RDL1 vertically penetrate through the polymer layer PM1 to connect the traces T of the redistribution layer RDL1 to the dies 60a/60b and the bridge 40, the vias V of the redistribution layer RDL2 vertically penetrates through the polymer layer PM2 to connect the traces T of the redistribution layers RDL2 to the traces T of the redistribution layer RDL1. The traces T are located on the polymer layers PM1, PM2, and are horizontally extending on the top surface of the polymer layers PM1, PM2, respectively. In some embodiments, the traces T in the same layer of the redistribution layer (such as RDL1 or RDL2) are interconnected to each other. In some embodiments, the pitch of the traces T of the redistribution layer RDL1/RLD2 is larger than the pitch of the conductive lines 15/22 of the bridge 40.

In some embodiments, the redistribution layer RDL3 is the topmost redistribution layer of the RDL structure 105, the redistribution layer RDL3 may include a plurality of vias V embedded in the polymer layer PM3 and a plurality of protruding portions P on the vias V and on the polymer layer PM3. The vias V penetrates through the polymer layer PM3 to connect the protruding portions P to the traces T of the redistribution layer RDL2.

In some embodiments, the redistribution layer RDL3 includes a plurality of conductive bumps or conductive pillars, but the disclosure is not limited thereto. In alternative embodiments, the redistribution layer RDL3 is an under-ball metallurgy (UBM) layer.

Still referring to FIG. 1F, thereafter, a plurality of connectors 106 are formed over and electrically connected to the redistribution layer RDL3 of the RDL structure 105. In some embodiments, the connectors 106 are referred as conductive terminals. In some embodiments, the connectors 106 may be ball grid array (BGA) connectors, solder balls, solder caps, controlled collapse chip connection (C4) bumps, or a combination thereof. In some embodiments, the material of the connector 106 includes copper, aluminum, lead-free alloys (e.g., gold, tin, silver, aluminum, or copper alloys) or lead alloys (e.g., lead-tin alloys). The connector 106 may be formed by a suitable process such as evaporation, plating, ball dropping, screen printing and reflow process, a ball mounting process or a C4 process. In some embodiments, metal posts or metal pillars may further be formed between the redistribution layer RDL3 and the connectors 106 (not shown). The connectors 106 are electrically connected to the dies 60a and 60b and the bridge 40 through the RDL structure 105.

Figure 1G:
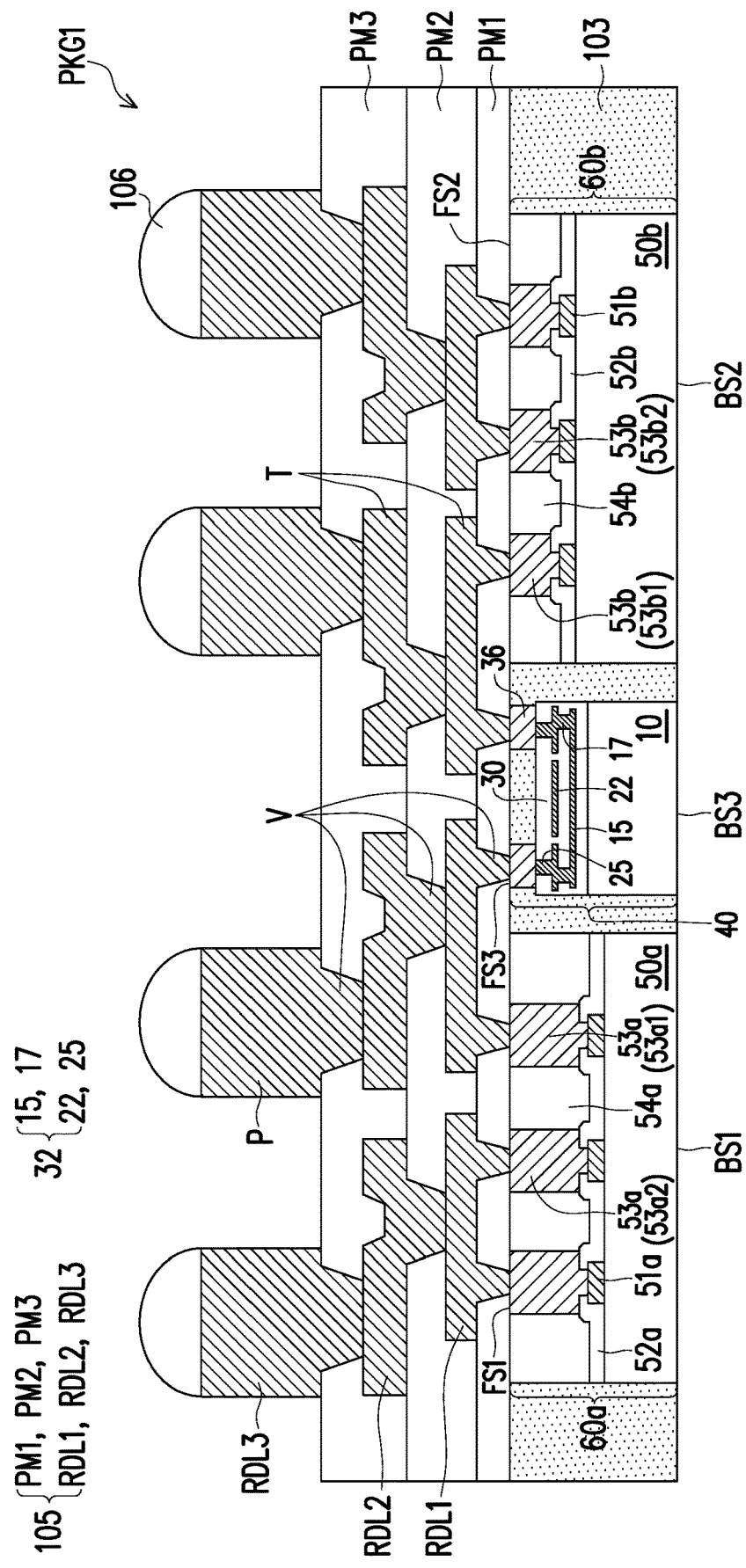

Referring to FIG. 1F and FIG. 1G, the de-bonding layer 101 is decomposed under the heat of light, and the carrier 100 is then released from the overlying structure. In some embodiments, the adhesive layer 102 is then removed by, for example, a cleaning process. The back surfaces BS1 and BS2 of the dies 60a and 60b, the back surface BS3 of the bridge 40 and the bottom surface of the encapsulant 103 are exposed. In alternative embodiments, the adhesive layer 102 may be optionally remained.

Referring to FIG. 1G, a package structure PKG1 is thus completed. The package structure PKG1 includes the die 60a, the die 60b, the bridge 40, the encapsulant 103, the RDL structure 105 and the conductive terminals 106. In some embodiments, the package structure PKG1 is also referred to as an integrated fan-out (InFO) package structure.

Figure 3A:
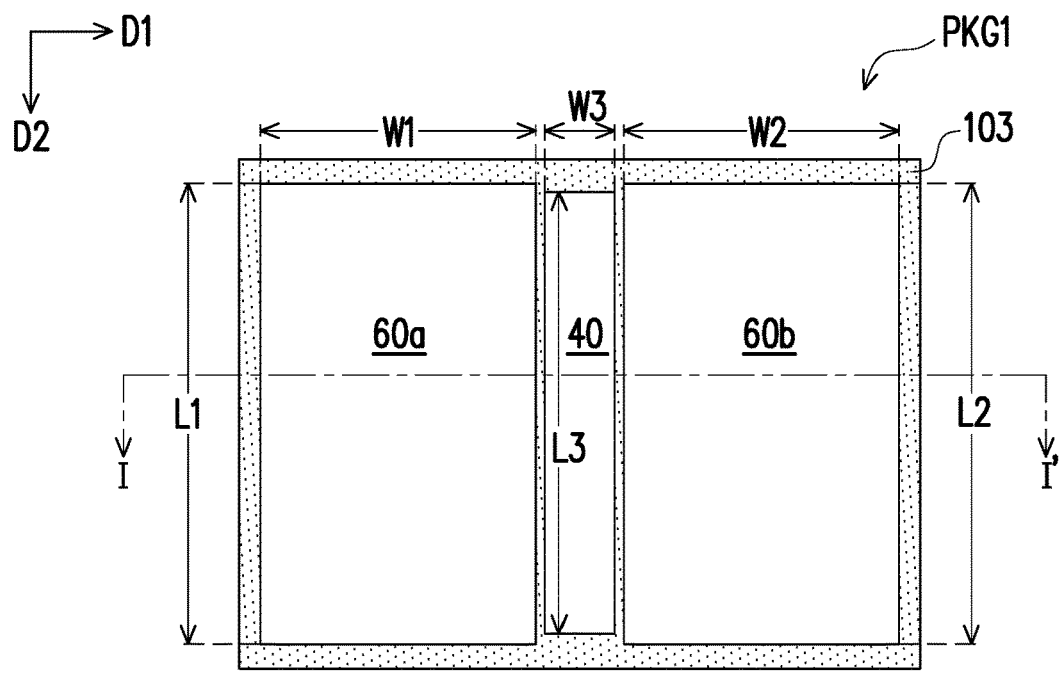
FIG. 3A to FIG. 3C respectively illustrate a plan view of a package structure according to some embodiments of the disclosure.

FIG. 3A illustrates a plan view (such as bottom view) of the package structure PKG1. FIG. 1G is the cross-sectional view along I-I' line of the FIG. 3A. Referring to FIG. 1G and FIG. 3A, in some embodiments, the dies 60a and 60b and the bridge 40 are arranged side by side, and are laterally encapsulated by the encapsulant 103. In some embodiments, the sizes of the dies 60a and 60b may be the same or different, and the size of the bridge 40 is smaller than the size of the die 60a and the size of the die 60b. For example, the die 60a has a width W1 and a length L1, the die 60b has a width W2 and a length L2, the bridge 40 has a width W3 and a length L3. The width W1, W2, W3 refers to the length of the die 60a, 60b and the bridge 40 along the first direction D1, respectively. The length L1, L2, L3 refers to the length of the die 60a, 60b and the bridge 40 along the second direction D2, respectively.

In some embodiments, the width W1 of the die 60a and the width W2 of the die 60b may be the same or different. The width W3 of the bridge 40 is less than the width W1 of the die 60a and the width W2 of the die 60b. In some embodiments, the ratio of the width W3 of the bridge 40 to the width W1 of the die 60a or the ratio of the width W3 of the bridge 40 to the width W2 of the die 60b ranges from 0.1 to 0.3, for example.

In some embodiments, the length L1 of the die 60a and the length L2 of the die 60b may be the same or different. The length L3 of the bridge 40 may be the same as or different from the length L1 of the die 60a and the length L2 of the die 60b. In some embodiments, the length L3 of the bridge 40 is less than the length L1 of the die 60a and the length L2 of the die 60b. In some embodiments, the ratio of the length L3 of the bridge 40 to the length L1 of the die 60a or the ratio of the length L3 of the bridge 40 to the length L2 of the die 60b ranges from 0.2 to 1, for example.

The die 60a and the die 60b may be the same types of dies or different types of dies. In one embodiment, both the die 60a and the die 60b are system-on-chips. In another embodiment, the die 60a is a system-on-chip, while the die 60b is another kind of die, such as a memory chip. In some embodiments, the die 60a and the die 60b are dies including active devices, passive devices or combinations thereof, while the bridge 40 is a die-to-die connector free of active devices or passive devices.

In some embodiments, the die 60a and the die 60b may be disposed on opposite sides of the bridge 40, that is, the bridge 40 may be laterally disposed between the die 60a and the die 60b. The die 60a and the die 60b are electrically connected to each other through the bridge 40 and the RDL structure 105. In some embodiments, some of the connectors 53a (such as 53a2) of the die 60a are electrically connected to some of the connectors 53b (such as 53b2) of the die 60b through the RDL structure 105. Some of the connectors 53a (such as 53a1) of the die 60a are electrically connected to some of the connectors 53b (such as 53b1) of the die 60b through the RDL structure 105 and the bridge 40. For example, the connectors 53a1 of the die 60a and the connectors 53b1 of the die 60b are connected to the connectors 36 of the bridge 40 through the redistribution layer RDL1, respectively. As such, the connectors 53a1 are electrically connected to the connectors 53b1 through the redistribution layer RDL1, the connectors 36 and the interconnection structure 32 of the bridge 40.

In the embodiments of the disclosure, since some of the connectors of the 53a and 53b of the dies 60a and 60b are connected to each other through the bridge, the routing density of the redistribution layers (especially the first redistribution layer RDL1) of the RDL structure 105 may be reduced, and the redistribution layer RDL1 or/and RDL2 may have a suitable pitch. In some embodiments in which the die 60a and the die 60b need high density die-to-die connection, the bridge 40 may include high (or ultra-high) density conductive lines and thus have fine (or ultra-fine) pitch conductive lines 15/22 to connect the dies 60a and 60b. Therefore, fine pitch redistribution layers may not be included in the RDL structure 105, and the issues may be caused by fine pitch redistribution layers are thus avoided.

In some embodiments, the conductive lines 15 and the conductive lines 22 of the bridge 40 have substantially the same pitch or different pitches. The traces T of the redistribution layer RDL1 and the traces T of the redistribution layer RDL2 may have substantially the same pitch or different pitches. In some embodiments, the pitch of the conductive lines 15/22 of the bridge 40 is less than the pitch of the traces T of the RDL structure 105. The ratio of the pitch of the conductive lines 15/22 of the bridge 40 to the pitch of the traces T of the RDL structure 105 may range from 0.02 to 0.5. In some embodiments, the conductive lines 15/22 of the bridge 40 have fine pitch. For example, the line width/space (L/S) of the conductive lines 15/22 may range from 0.4 μm/0.4 μm to 2 μm/2 μm, such as 0.8 μm/0.8 μm. The traces T of the redistribution layers RDL1/RDL2 have a relative larger pitch. For example, the line width/space (L/S) of the traces T may range from 1 μm/1 μm to 10 μm/10 μm, such as 2 μm/2 μm or larger than 2/2 μm.

Still referring to FIG. 1G and FIG. 3A, the encapsulant 103 is laterally aside the dies 60a and 60b and the bridge 40 to encapsulate sidewalls of the dies 60a and 60b and the bridge 40. The space between the die 60a and the bridge 40, and the space between the die 60b and the bridge 40 are filled with the encapsulant 103. In some embodiments in which the bridge 40 is free of a passivation layer on sidewalls of the connectors 36, the encapsulant 103 is further formed on the dielectric structure 30 and surrounds sidewalls of the connectors 36 of the bridge 40.

In some embodiments, the bottom surface of the encapsulant 103 and the bottom surfaces (that is, back surfaces BS1/BS2/BS3) of the die 60a, the die 60b and the bridge 40 are substantially coplanar with each other, and are exposed. The top surface of the encapsulant 103 and the top surfaces (that is, front surfaces FS1/FS2/FS3) of the die 60a, the die 60b and the bridge 40 are substantially coplanar with each other. The top surface of the encapsulant 103 and the top surfaces of the passivation layers 54a and 54b are in physical contact with the bottom surface of the polymer layer PM1. The top surfaces of the connectors 53a, 53b and 36 are in physical contact with the polymer layer PM1 and the redistribution layer RDL1 of the RDL structure 105.

In the foregoing embodiments, the package structure includes two dies and one bridge, but the disclosure is not limited thereto. The number of the dies and the bridge included in the package structure may be adjusted according to product design.

Figure 3B:
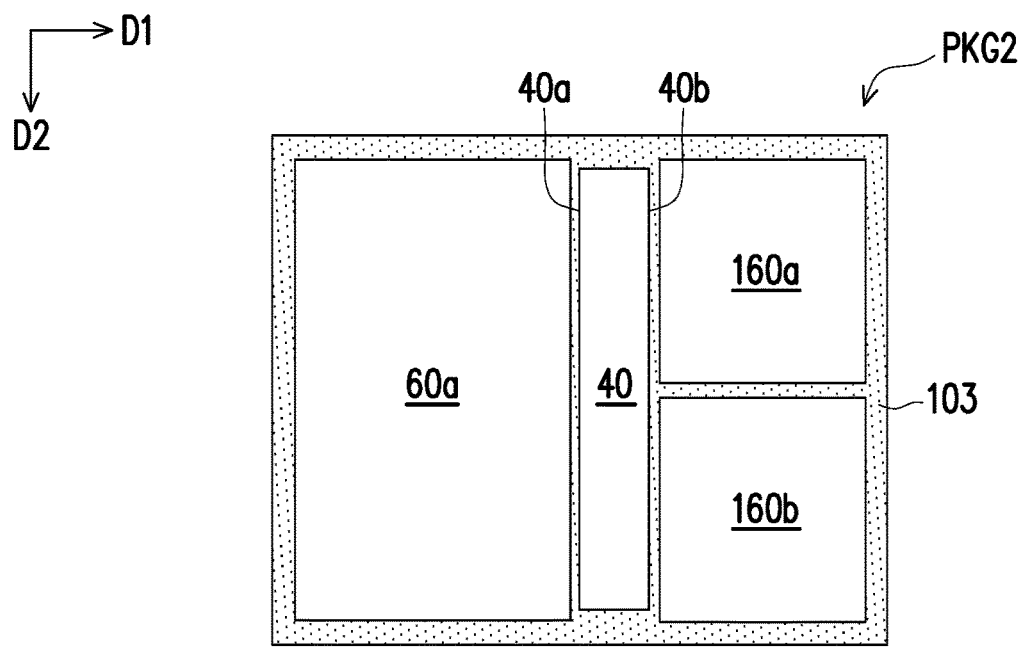
Figure 3C:
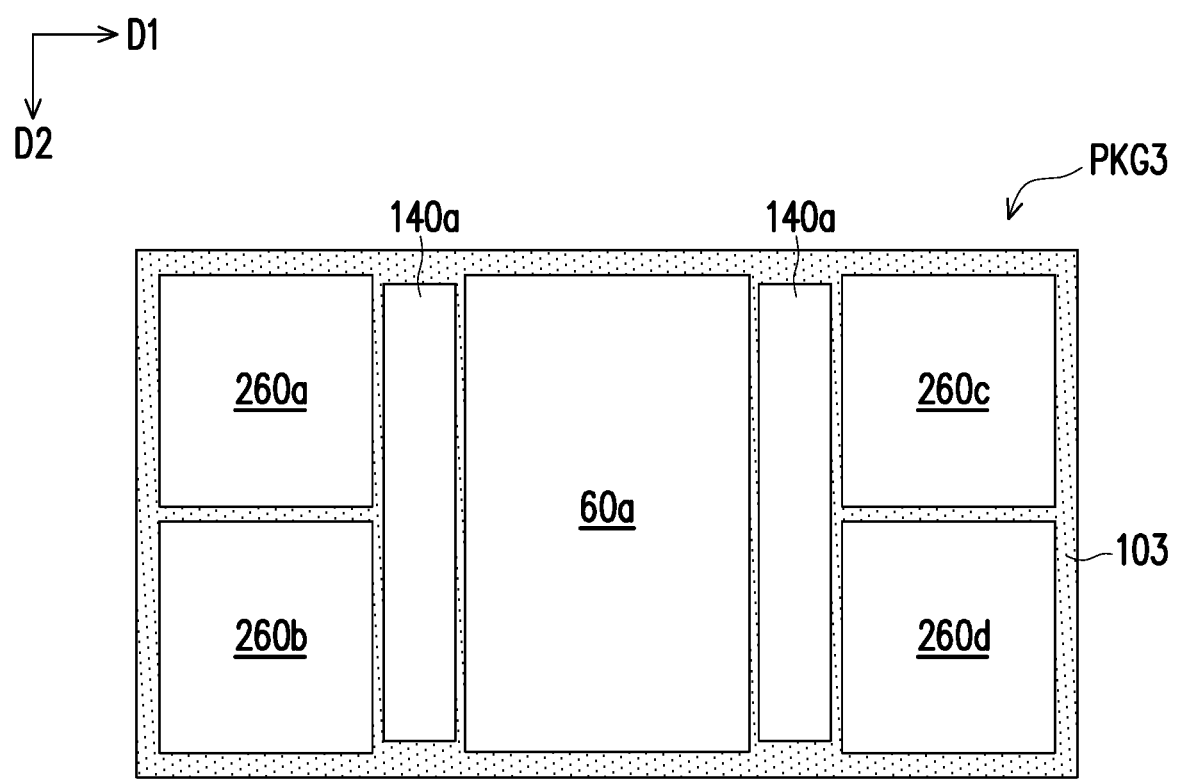

FIG. 3B and FIG. 3C illustrates a plan view of a package structure including more than two dies according to some embodiments of the disclosure. In the following embodiments, the dies are electrically connected to each other through the bridge and the RDL structure, which is similar to the package structure PKG1, and are not described again.

Referring to FIG. 3B, in some embodiments, a package structure PKG2 may include a die 60a, a die 160a, a die 160b and a bridge 40. The dies 60a, 160a and 160b and the bridge 40 may be arranged side by side and laterally encapsulated by the encapsulant 103. For example, the die 60a and the bridge 40 and the die 160a or 160b are arranged side by side along the first direction D1, and the dies 160a and 160b are arranged side by side along the second direction D2. In some embodiments, the bridge 40 is laterally located between the die 60a and the dies 160a and 160b. In other words, the bridge 40 includes a first side 40a and a second side 40b opposite to each other, the die 60a is located on the first side 40a of the bridge 40, and the dies 160a and 160b are located on the second side 40b of the bridge 40. The dies 60a, 160a, 160b may be the same types of dies or different types of dies and may have the same or different sizes. In some embodiments, the die 160a and the die 160b are the same types of the dies, and the die 60a is a different type of die than the dies 160a and 160b. In one embodiment, the die 60a is a system-on-chip, while the dies 160a and 160b are memory chips. However, the disclosure is not limited thereto.

Referring to FIG. 3C, in some embodiments, a package structure PKG3 includes dies 60a, 260a, 260b, 260c and 260d and the bridges 140a and 140b arranged side by side. In some embodiments, the bridges 140a and 140b, the die 60a, the die 260a or 260b, and the die 260c or 260d are arranged side by side along the first direction D1, the die 260a and the die 260b are arranged side by side along the second direction D2, the die 260c and the die 260d are arranged side by side along the second direction D2. The dies 60a, 260a, 260b, 260c and 260d and the bridges 140a and 140b are laterally encapsulated by the encapsulant 103. In some embodiments, the bridge 140a is disposed between the dies 260a and 260b and the die 60a, the bridge 140b is disposed between the dies 260c and 260d and the die 60a. The dies 60a, 260a, 260b, 260c and 260d may be the same types of dies or different types of dies, and may have the same or different sizes. In some embodiments, the dies 260a, 260b, 260c and 260d are the same types of dies and have similar sizes, while the die 60a is a different type of die than the dies 260a, 260b, 260c and 260d and have a relative larger size. For example, the die 60a is a system-on-chip, and the dies 260a, 260b, 260c and 260d are memory chips. However, the disclosure is not limited thereto.

In the embodiments of the disclosure, a package structure includes at least two dies, and the dies are electrically connected to each other through a RDL structure and one or more bridges. A plurality of bridges having fine pitch conductive lines may be formed form a same wafer. Therefore, the routing density of the RDLs may be reduced and the RDLs may have a suitable pitch, and the cost of forming the package structure may be reduced. In some embodiments, a testing process may be performed to check whether the bridge is good, and good bridge is placed on the carrier when forming the package structure, therefore, the yield of the package structure may be well-controlled.

Further, the bridge and the dies are arranged side by side, and the bridge is electrically connected to the dies through the RDL structure instead of solder bumps, that is, there is no solder bumps embedded in the package structure, which may increase the reliability of the package structure. On the other hand, in some embodiments in which coefficient of thermal expansion (CTE) mismatch may exist between the encapsulant and the dies, since the fine pitch conductive lines are located on the substrate of the bridge laterally aside the encapsulant and the dies, the stress caused by the CTE mismatch is not applied to the fine pitch conductive lines included in the bridge 40, and therefore, the crack issue of the fine-pitch conductive lines is avoided.

In accordance with some embodiments of the disclosure, a package structure includes a first die, a second die, a bridge, an encapsulant and a redistribution layer (RDL) structure. The bridge is arranged side by side with the first die and the second die. The encapsulant laterally encapsulates the first die, the second die and the bridge. The RDL structure is disposed on the first die, the second die, the bridge and the encapsulant. The first die and the second die are electrically connected to each other through the bridge and the RDL structure.

In accordance with alternative embodiments of the disclosure, a package structure includes a first die, a second die, a bridge, an encapsulant and a RDL structure. The bridge is disposed between the first die and the second die, wherein the bridge is free of active or passive devices. The encapsulant encapsulates sidewalls of the first die, sidewalls of the second die and sidewalls of the bridge. The RDL structure is disposed on and electrically connected to the first die, the second die, and the bridge. A top surface of the bridge is coplanar with a top surface of the first die and a top surface of the second die.

In accordance with some embodiments of the disclosure, a method of forming a package structure includes the following processes. A first die, a second die and a bridge are arranged side by side. An encapsulant is formed to laterally encapsulate sidewalls of the first die, sidewalls of the second die and sidewalls of the bridge. An RDL structure is formed on the first die, the second die and the bridge. The first die and the second die are electrically connected to each other through the bridge and the RDL structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first die and a second die;
   a bridge, arranged side by side with the first die and the second die;
   an encapsulant, laterally encapsulating the first die, the second die and the bridge;
   a redistribution layer (RDL) structure, disposed on the first die, the second die, the bridge and the encapsulant,
   wherein the first die and the second die are electrically connected to each other through the bridge and the RDL structure,
   wherein there is free of active device disposed on the bridge and vertically between the bridge and the RDL structure, wherein a top surface of the bridge is coplanar with a top surface of the first die and a top surface of the second die;
   wherein the bridge is free of active devices, and
   wherein the top surfaces of the first die, the second die and the bridge are in physical contact with a polymer layer and a redistribution layer of the RDL structure.

2. The package structure of claim 1, wherein a top surface of the encapsulant is coplanar with the top surfaces of the first die, the second die and the bridge.

3. The package structure of claim 1, wherein a bottom surface of the bridge is coplanar with a bottom surface of the first die and a bottom surface of the second die.

4. The package structure of claim 1, wherein portions of the encapsulant are laterally between the bridge and the first die, and laterally between the bridge and the second die.

5. The package structure of claim 1, wherein the bridge is free of passive devices.

6. The package structure of claim 5, wherein
   the bridge comprises an interconnection structure and a connector on the interconnection structure, the interconnection structure comprises a conductive line and a via; and the connector is connected to the conductive line through the via.

7. The package structure of claim 6, wherein the conductive line has a pitch less than a pitch of a redistribution layer of the RDL structure.

8. The package structure of claim 6, where the connector of the bridge is in physical contact with bottom surfaces of the redistribution layer and the polymer layer of the RDL structure.

9. The package structure of claim 6, wherein a portion of the encapsulant is disposed on the interconnection structure and laterally encapsulating sidewalls of the connector.

10. The package structure of claim 1, wherein a width of the bridge is less than a width of the first die and a width of the second die.

11. A package structure, comprising:
a first die and a second die;
a bridge, disposed between the first die and the second die, wherein the bridge is free of active or passive devices;
an encapsulant, encapsulating sidewalls of the first die, sidewalls of the second die and sidewalls of the bridge;
a RDL structure, disposed on and electrically connected to the first die, the second die, and the bridge,
wherein a top surface of the bridge is coplanar with a top surface of the first die and a top surface of the second die,
wherein there is free of active device disposed on the bridge and vertically between the bridge and the RDL structure, and wherein the top surfaces of the first die, the second die and the bridge are in physical contact with a polymer layer and a redistribution layer of the RDL structure.

12. The package structure of claim 11, wherein
the bridge comprises a first connector and a second connector;
the first connector is connected to the first die through a first portion of the redistribution layer of the RDL structure; and
the second connector is connected to the second die through a second portion of the redistribution layer of the RDL structure.

13. The package structure of claim 11, wherein the bridge comprises conductive lines having a pitch less than a pitch of the redistribution layer of the RDL structure.

14. The package structure of claim 11, wherein a portion of the encapsulant is laterally between the first die and the bridge, and laterally between the second die and the bridge.

15. A method of forming a package structure, comprising:
arranging a first die, a second die and a bridge side by side;
forming an encapsulant laterally encapsulating sidewalls of the first die, sidewalls of the second die and sidewalls of the bridge;
forming an RDL structure on the first die, the second di; the bridge and the encapsulant,
wherein the first die and the second die are electrically connected to each other through the bridge and the RDL structure,
wherein there is free of active device disposed on the bridge and vertically between the bridge and the RDL structure, wherein a top surface of the bridge is coplanar with a top surface of the first die and a top surface of the second die;
wherein the bridge is free of active devices, and
wherein the top surfaces of the first die, the second die and the bridge are in physical contact with a polymer layer and a redistribution layer of the RDL structure.

16. The method of claim 15, wherein
the first die is sigulated from a first wafer comprising a plurality of first dies, the bridge is singulated from a second wafer comprising a plurality of bridges; and
the number of the bridges comprised in the second wafer is larger than the number of the first dies comprised in the first wafer.

17. The method of claim 15, wherein the bridge is formed by a forming method, comprising:
providing a substrate, wherein the substrate is free of active or passive devices;
forming an interconnection structure on the substrate, the interconnection structure comprises conductive lines and vias connected to each other; and
forming a plurality of connectors on the interconnection structure.

18. The method of claim 17, wherein the forming the interconnection structure comprising forming the conductive lines having a pitch less than a pitch of the redistribution layer of the RDL structure.

19. The method of claim 15, wherein the forming the encapsulant comprising:
forming an encapsulant material layer to encapsulant sidewalls and the top surfaces of the first die, the second die and the bridge;
performing a planarization process to at least remove a portion of the encapsulant material layer over the top surfaces of the first die, the second die and the bridge.

20. The method of the claim 19, wherein after the performing the planarization process, the top surface of the first die, the top surface of the second die, the top surface of the bridge and a top surface of the encapsulant are coplanar with each other.

* * * * *